(12) United States Patent
Huang et al.

(10) Patent No.: US 7,102,194 B2
(45) Date of Patent: Sep. 5, 2006

(54) HIGH VOLTAGE AND LOW ON-RESISTANCE LDMOS TRANSISTOR HAVING RADIATION STRUCTURE AND ISOLATION EFFECT

(75) Inventors: Chih-Feng Huang, Jhubei (TW); Ta-yung Yang, Milpitas, CA (US); Jenn-yu G. Lin, Taipei (TW); Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 219 days.

(21) Appl. No.: 10/919,916

(22) Filed: Aug. 16, 2004

(65) Prior Publication Data

US 2006/0033156 A1    Feb. 16, 2006

(51) Int. Cl.
*H01L 29/94* (2006.01)
(52) U.S. Cl. ...................... 257/341; 257/335

(58) Field of Classification Search .............. 257/341, 257/335, 337, 343
See application file for complete search history.

(56) References Cited

U.S. PATENT DOCUMENTS 6,593,621 B1 *  7/2003  Tsuchiko et al. ........... 257/335
2001/0053581 A1 * 12/2001  Mosher et al. .............. 438/297

* cited by examiner

*Primary Examiner*—Douglas W. Owens
(74) *Attorney, Agent, or Firm*—J.C. Patents

(57) ABSTRACT

A high voltage LDMOS transistor according to the present invention includes at least one P-field block in the extended drain region of the N-well. The P-field blocks form junction-fields in the N-well for equalizing the capacitance of parasitic capacitors between the drain region and the source region and fully deplete the drift region before breakdown occurs. A higher breakdown voltage is therefore achieved and the N-well having a higher doping density is thus allowed. The source region and P-field blocks enclose the drain region, which makes the LDMOS transistor self-isolated.

14 Claims, 5 Drawing Sheets

HIGH VOLTAGE AND LOW ON-RESISTANCE LDMOS TRANSISTOR HAVING RADIATION STRUCTURE AND ISOLATION EFFECT

BACKGROUND OF THE INVENTION

1. Field of the Invention

The present invention relates to semiconductor devices, and more particularly to a lateral power MOSFET having radiation structure and isolation effect.

2. Description of Related Art

The development of single chip process for integrating power switches with control circuitries is a major trend in the field of power IC development. The LDMOS (lateral double diffusion MOS) process in particular is currently being applied to manufacture monolithic ICs. The LDMOS process involves performing planar diffusion on the surface of a semiconductor substrate to form a main current path oriented in the lateral direction.

In recent developments, many high-voltage LDMOS transistors have been proposed. However, the drawback of these prior arts is that aforementioned LDMOS transistors have higher on-resistance. Therefore, high voltage and low on-resistance LDMOS transistors are proposed. Although a high voltage and low on-resistance LDMOS transistor can be manufactured, the complexity of the production processes increases the production cost and/or reduces the production yield. Another disadvantage of these proposed LDMOS transistors is their non-isolated source structure. A non-isolated transistor current could flow around the substrate. This may generate noise interference in the control circuit. Besides, the current of the LDMOS transistor can generate a ground bounce to disturb the control signals. And it is needed to provide a kind of isolation structure between elements to prevent disturbance in between each other. In order to solve these problems, the present invention proposes a LDMOS structure to realize a high breakdown voltage, low on-resistance and isolated transistor for the monolithic integration.

SUMMARY OF THE INVENTION

A high voltage LDMOS transistor according to the present invention includes a P-substrate. A first diffusion region and a second diffusion region containing N conductivity-type ions form an N-well in the P-substrate. The first diffusion region further develops an extended drain region. A drain diffusion region containing N+ conductivity-type ions forms a drain region in the extended drain region. A third diffusion region containing P conductivity-type ions forms separated P-field blocks located in the extended drain region. The P-field blocks have different sizes. A smallest size P-field block is nearest to the drain region. A source diffusion region having N+ conductivity-type ions forms a source region in the N-well which is formed by the second diffusion region. A contact diffusion region containing P+ conductivity-type ions forms a contact region in the N-well which is formed by the second diffusion region. A fourth diffusion region containing P conductivity-type ions forms an isolation P-well in the N-well which is formed by the second diffusion region for preventing from breakdown. The isolation P-well located in the second diffusion region encloses the source region and the contact region. A largest size P-field block is located nearest to the source region. The P-field blocks located in the extended drain region form junction-fields in the N-well to deplete the drift region and equalize the capacitance of parasitic capacitors between the drain region and the source region. A channel is developed between the source region and the drain region extending through the N-well. The separated P-field blocks can further improve the on-resistance of the channel. The source diffusion region centrally encircles said drain region, which achieves isolation effect. A gate electrode is formed above the portion of the channel to control a current flow in the channel. Furthermore, the portion of the N-well generated by the second diffusion region produces a low-impedance path for the source region, which restricts the current flow in between the drain region and the source region.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Generally, high breakdown voltage transistors do not have designed pattern for isolating from each other. To improve the isolation effect of transistors and to increase applicability, the present invention further provides a structure with isolation effect for high breakdown voltage transistors.

Figure 1:
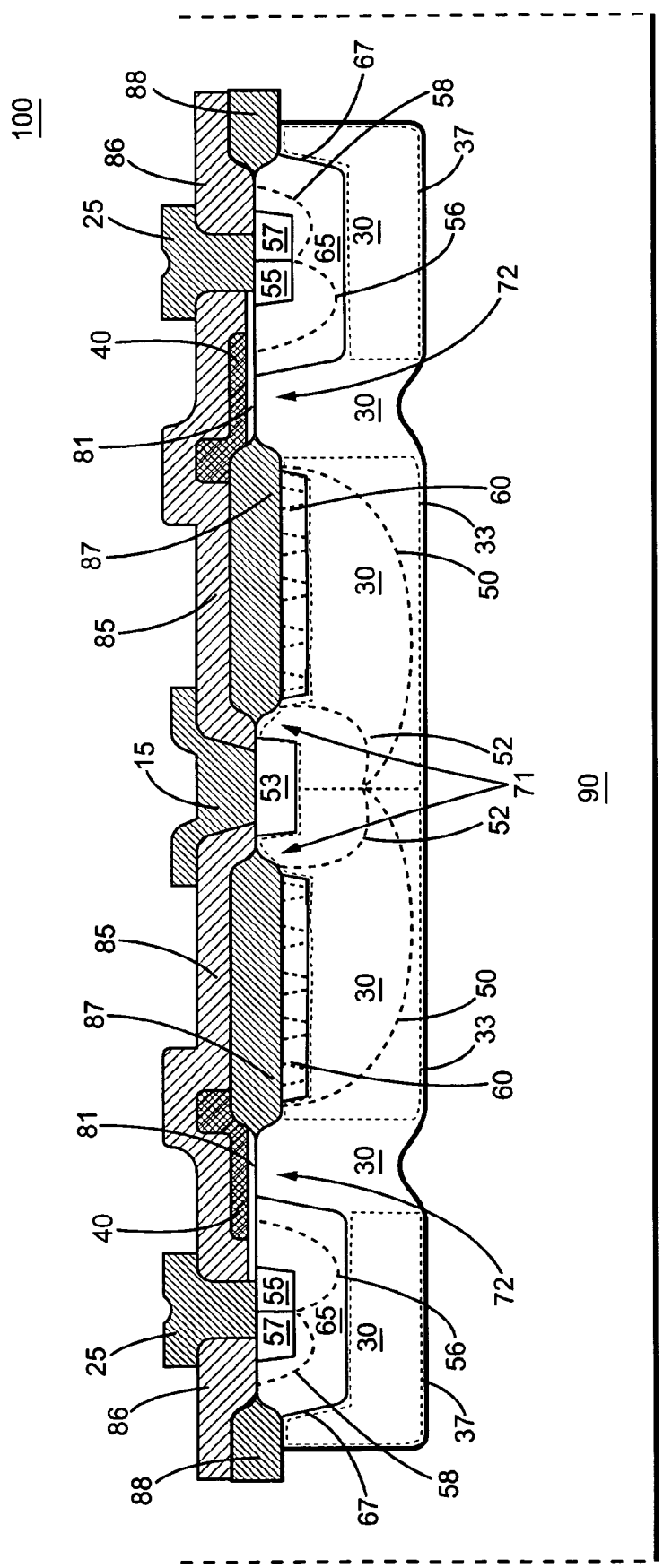
FIG. 1 is a cross-sectional view of a LDMOS transistor according to an embodiment of the present invention.

FIG. 1 is a cross-sectional view of an LDMOS transistor 100 according to the present invention. The LDMOS transistor 100 includes a P-substrate 90. The LDMOS transistor 100 further includes a first diffusion region 33 and a second diffusion region 37 containing N conductivity-type ions to form an N-well 30 in the P-substrate 90. The first diffusion region 33 comprises an extended drain region 50. A drain diffusion region 53 containing N+ conductivity-type ions forms a drain region 52 in the extended drain region 50. A third diffusion region containing P conductivity-type ions forms P-field blocks 60 in the extended drain region 50. The P-field blocks 60 can have different size, shape, and quantity. Embodiments with different kinds of P-field blocks are illustrated from FIG. 2 to FIG. 5. A source diffusion region 55 having N+ conductivity-type ions forms a source region 56 in the N-well 30 formed by the second diffusion region 37. A contact diffusion region 57 containing P+ conductivity-type ions forms a contact region 58 in the N-well 30 which is formed by the second diffusion region 37. A fourth diffusion region 67 containing P conductivity-type ions forms an isolation P-well 65 in the N-well 30 which is formed by the second diffusion region 37 for preventing from breakdown. The isolation P-well 65 encloses the source region 56 and the contact region 58. The aforementioned source region and P-field block centrally encircle the drain region and then provide isolation effect.

A channel is developed between the source region 56 and the drain region 52 extending through the N-well 30. The P-field blocks 60 further reduce the on-resistance of the channel. A thin gate oxide 81 and a thick field oxide 87 are formed over the P-substrate 90. A polysilicon gate electrode 40 is formed above the gate oxide 81 and the field oxide 87 to control a current flow in the channel. A drain-gap 71 is formed between the drain diffusion region 53 and the field oxide 87 to maintain a space between the drain diffusion region 53 and the field oxide 87. A source-gap 72 is formed between the field oxide 87 and the isolation P-well 65 to maintain a space between the field oxide 87 and the isolation P-well 65.

Insulation layers 85 and 86 cover the polysilicon gate electrode 40 and the field oxide 87 and 88. The insulation layers 85 and 86 are, for example, made of silicon dioxide. A drain metal contact 15 is a metal electrode for contacting with the drain diffusion region 53. A source metal contact 25 is a metal electrode for contacting with the source diffusion region 55 and the contact diffusion region 57.

Figure 2:
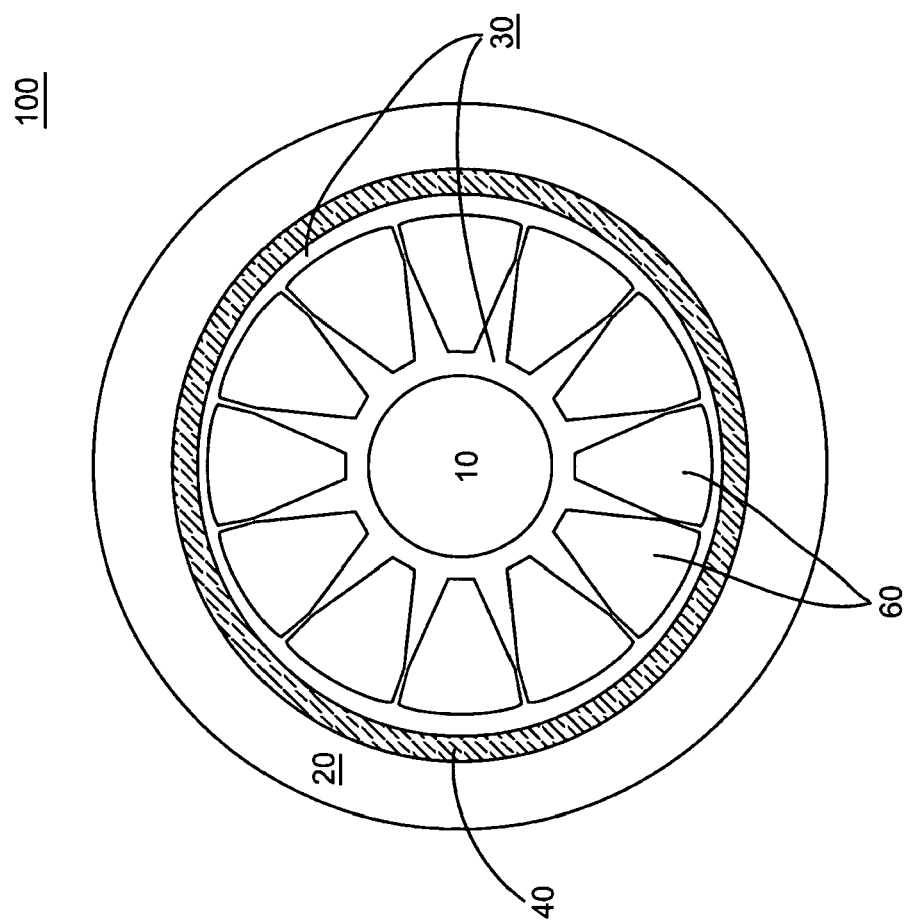
FIG. 2 is a first embodiment of the present invention, which is a top view of the LDMOS transistor of the present invention.

FIG. 2 shows the first embodiment of the present invention, which is a top view of the LDMOS transistor 100. According to this embodiment, the LDMOS transistor 100 is in circular shape. The LDMOS transistor 100 includes a drain 10, a source 20 and a gate 40. Referring to FIG. 1 and FIG. 2, the extended drain region 50 and the drain diffusion region 53 both form the drain 10. The isolation P-well 65, the source diffusion region 55 and the contact diffusion region 57 form the source 20. The N-well 30 enclosing the P-field block 60 is connected from the drain 10 to the source 20. The portion of the N-well 30 located in between a plurality of P-field block 60 reduces the on-resistance of the channel.

The P-field block 60 is located in the extended drain region 50 of the N-well 30. The N-well 30, the P-field block 60 deplete the drift region, which build electrical fields in the N-well 30 to increase the breakdown voltage. In order to get higher breakdown voltage, the extended drain region 50 must be fully depleted before breakdown occurs. The N-well 30 and P-field block 60 enable the extended drain region 50 to be depleted before breakdown occurs even though the doping density of the drift region is high. This allows the drift region to have higher doping density and accomplish low resistance. The size and shape of the P-field block 60 and the doping density of the N-well 30 can be optimized to achieve the desired effect. The P-field block 60 and the source 20 enclosing the drain 10 provide isolation effect. Due to the enclosing structure, the P-field block 60 is formed in radiation shape. By modulating the shape of the P-field block 60, it is able to achieve high breakdown voltage and low on-resistance characteristics. Therefore, a high breakdown voltage and low on-resistance LDMOS transistor 100 can be realized. Furthermore, the portion of the N-well 30 formed by the second diffusion region 37 produces a low-impedance path for the source region 56, which restricts the current flow in between the drain region 52 and the source region 56.

Figure 3:
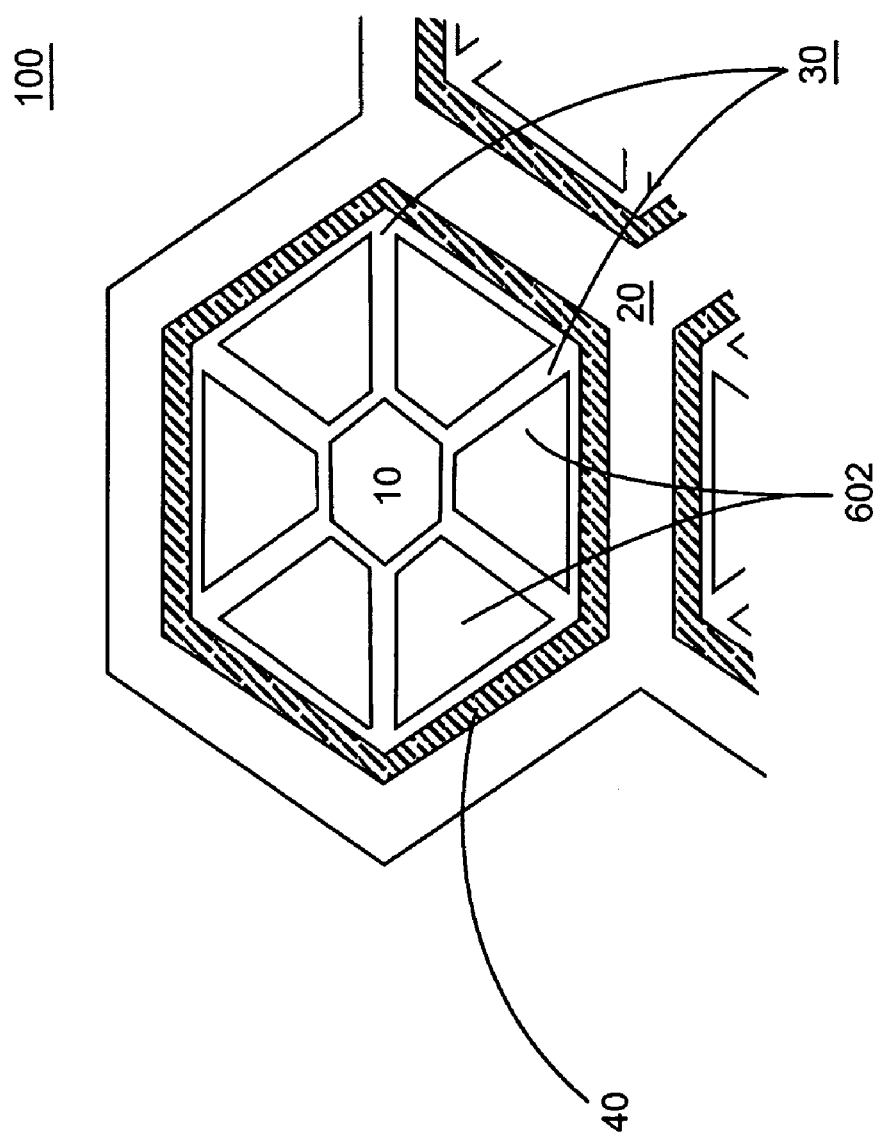
FIG. 3 is a second embodiment of the present invention, which is a top view of the LDMOS transistor of the present invention.

FIG. 3 shows a second embodiment of the present invention, which is a top view of the LDMOS transistor 100. According to this embodiment, the LDMOS transistor 100 is in polygonal shape, e.g. a hexagon. Properly determining the length of side and interior angle of polygon facilitates the combination with other transistors as shown in FIG. 3. This could form a common source structure for die-space saving. A P-field block 602 located in the N-well 30 can be in suitable shape with suitable concentration for modulating to achieve high breakdown voltage and low on-resistance effects. The structure in FIG. 3 illustrates that the area use efficiency of wafer can be improved.

Figure 4:
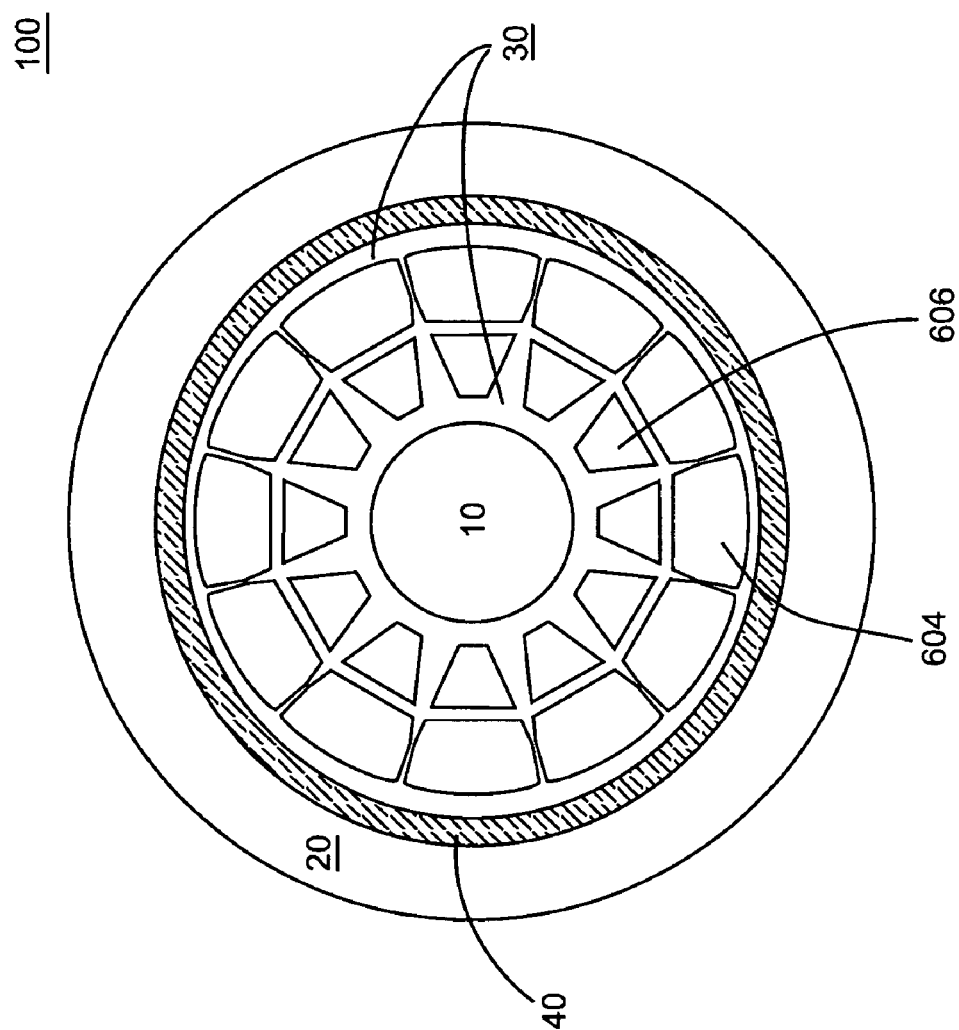
FIG. 4 is a third embodiment of the present invention, which is a top view of the LDMOS transistor of the present invention.

FIG. 4 shows a third embodiment of the present invention, which is a top view of the LDMOS transistor 100. According to this embodiment, the LDMOS transistor 100 is in circular shape. The P-field blocks 604 and 606 located in a single radial direction within the N-well 30 are at least one block for modulating to achieve different breakdown voltage and on-resistance effects.

Figure 5:
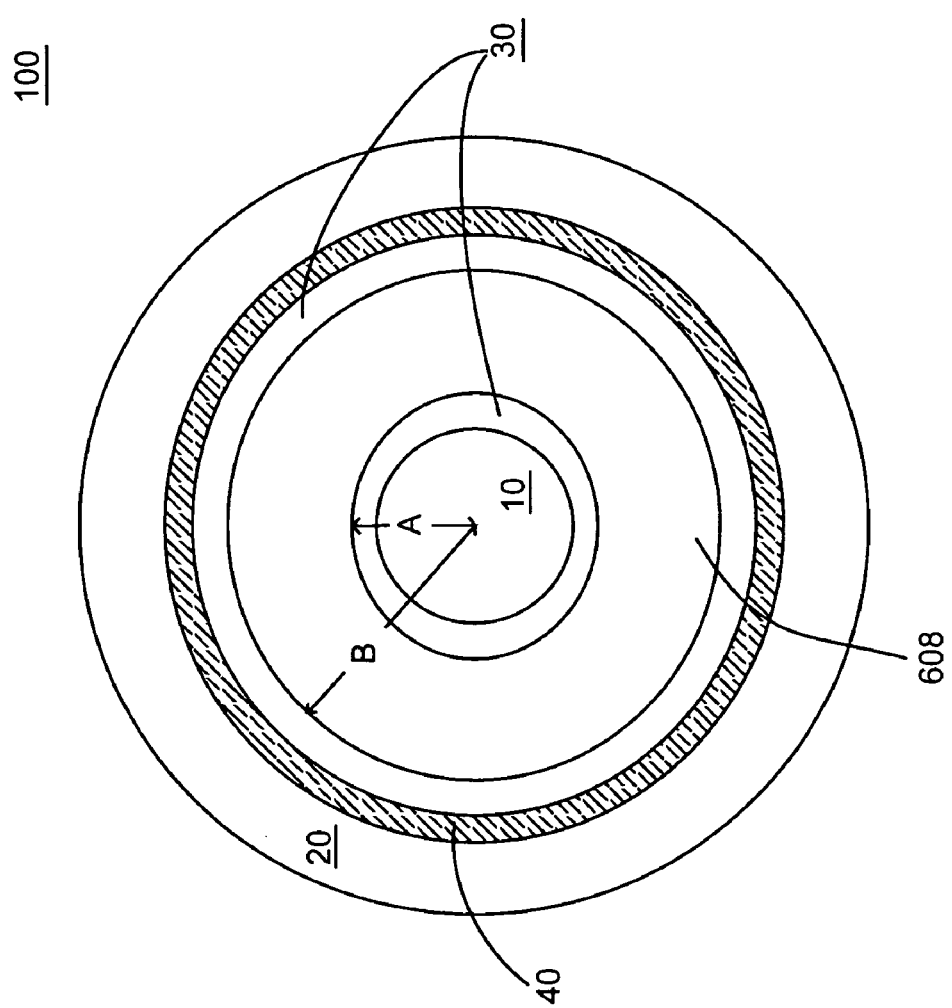
FIG. 5 is a fourth embodiment of the present invention, which is a top view of the LDMOS transistor of the present invention.

FIG. 5 shows the fourth embodiment of the present invention, which is the top view of the LDMOS transistor 100. According to this embodiment, the LDMOS transistor 100 is in circular shape. The P-field block 608 located in the N-well 30 is in a ringlike shape. By modulating the internal diameter A and external diameter B, it is able to achieve different breakdown voltage and on-resistance effects.

The structure of the LDMOS transistor 100, according to an embodiment of the present invention, has the features of high breakdown voltage, low on-resistance and isolation effect. Furthermore, the structure of the LDMOS transistor 100 can be fabricated at a low cost and with high production yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transistor, comprising:
   a P-substrate;
   a first diffusion region and a second diffusion region, having N conductivity-type ions form an N-well in said P-substrate, wherein said first diffusion region comprises an extended drain region;
   a drain diffusion region, containing N+ conductivity-type ions, forming a drain region in said extended drain region;
   a plurality of P-field blocks, formed in said extended drain region encircling said drain region, wherein sizes and shapes of said P-field blocks can be adjusted for adjusting junction fields;
   a source diffusion region, having N+ conductivity-type ions, wherein said source diffusion region forms a source region in said N-well which is formed by said second diffusion region and encircles said drain region;
   a channel, formed between said drain region and said source region;
   a gate electrode, formed over said channel to control a current flow in said channel;
   a contact diffusion region, containing P+ conductivity-type ions, wherein said contact diffusion region forms a contact region in said N-well which is formed by said second diffusion region; and
   an isolation P-well, formed in said N-well which is formed by said second diffusion region for preventing from breakdown, wherein said isolation P-well formed in said second diffusion region encloses said source region and said contact region.

2. The transistor as claimed in claim 1, wherein said source diffusion region and said P-field blocks encircle said drain region to achieve isolation effect.

3. The transistor as claimed in claim 2, wherein said P-field blocks are formed in said extended drain region of said N-well, wherein said N-well depletes a drift region, equalizes the capacitance of parasitic capacitors between said drain region and said source region, and decreases an on-resistance of said channel.

4. The transistor as claimed in claim 2, wherein said P-field blocks can be designed in different patterns, sizes and shapes to increase the breakdown voltage and decrease the on-resistance.

5. The transistor as claimed in claim 4, wherein said P-field blocks are in ringlike shape, wherein modulating an internal diameter and an external diameter of said P-field blocks can increase the breakdown voltage and decrease the on-resistance.

6. The transistor as claimed in claim 2, wherein said source diffusion region can be in ringlike shape and at least one P-field block is located in a single radial direction, wherein modulating the quantities and shapes of said P-field blocks can increase the breakdown voltage and decrease the on-resistance.

7. The transistor as claimed in claim 2, wherein said source diffusion region can be in polygonal shape, wherein adjusting a length of side and interior angle said source diffusion region in polygonal shape facilitates the combination with other transistors, which forms a common source structure for die-space saving.

8. A transistor, comprising:
a P-substrate;
an N-well, formed in said P-substrate, having an extended drain region;
a drain region, containing N+ conductivity-type ions, formed in said extended drain region;
a plurality of P-field blocks, formed in said extended drain region encircling said drain region, wherein sizes and shapes of said P-field blocks can be adjusted for adjusting junction fields;
a source region, having N+ conductivity-type ions, formed in said N-well and encircling said drain region;
a channel, formed between said drain region and said source region;
a gate electrode, formed over said channel to control a current flow in said channel;
a contact region, containing P+ conductivity-type ions, formed in said N-well; and
an isolation P-well, formed in said N-well, for preventing from breakdown, wherein said isolation P-well encloses said source region and said contact region.

9. The transistor as claimed in claim 8, wherein said source region and said P-field blocks encircle said drain region to achieve isolation effect.

10. The transistor as claimed in claim 9, wherein said P-field blocks are formed in said extended drain region of said N-well, wherein said N-well depletes a drift region equalizes the capacitance of parasitic capacitors between said drain region and said source region, and decreases an on-resistance of said channel.

11. The transistor as claimed in claim 9, wherein said P-field blocks can be designed in different patterns, sizes and shapes to increase the breakdown voltage and decrease the on-resistance.

12. The transistor as claimed in claim 9, wherein said P-field blocks are in ringlike shape wherein modulating an internal diameter and an external diameter of said P-field blocks can increase the breakdown voltage and decrease the on-resistance.

13. The transistor as claimed in claim 9, wherein said source region can be in ringlike shape and at least one P-field block is located in a single radial direction, wherein modulating the quantities and shapes of said P-field blocks can increase the breakdown voltage and decrease the on-resistance.

14. The transistor as claimed in claim 9, wherein said source region can be in polygonal shape, wherein adjusting a length of side and interior angle of said source region in polygon shape facilitates the combination with other transistors, which forms a common source structure for die-space saving.

* * * * *